(12) United States Patent
Jek et al.

(10) Patent No.: US 8,349,402 B2
(45) Date of Patent: Jan. 8, 2013

(54) APPLYING VAPOUR PHASE ALUMINIDE COATING ON AIRFOIL INTERNAL CAVITIES USING IMPROVED METHOD

(75) Inventors: Kin Keong Jek, Chestervale (SG); Balaji R. Garimella, Glendale Park (SG)

(73) Assignee: United Technologies Corporation, Hartford, CT (US)

(*) Notice: Subject to any disclaimer, the term of this patent is extended or adjusted under 35 U.S.C. 154(b) by 274 days.

(21) Appl. No.: 12/763,633

(22) Filed: Apr. 20, 2010

(65) Prior Publication Data

US 2011/0045181 A1    Feb. 24, 2011

(30) Foreign Application Priority Data

Aug. 21, 2009   (SG) ................ 200905613-6

(51) Int. Cl.
*C23C 16/00*   (2006.01)

(52) U.S. Cl. ............... 427/237; 427/230; 427/248.1

(58) Field of Classification Search .......... 427/230, 427/237, 248.1
See application file for complete search history.

(56) References Cited

U.S. PATENT DOCUMENTS

| 4,290,391 | A | * | 9/1981 | Baldi | 122/511 |
|---|---|---|---|---|---|
| 4,347,267 | A | * | 8/1982 | Baldi | 427/237 |
| 4,978,558 | A | | 12/1990 | Lamm | |
| 5,071,678 | A | * | 12/1991 | Grybowski et al. | 427/253 |
| 5,368,888 | A | * | 11/1994 | Rigney | 427/237 |
| 5,928,725 | A | * | 7/1999 | Howard et al. | 427/237 |
| 6,332,926 | B1 | | 12/2001 | Pfaendtner et al. | |
| 6,616,969 | B2 | | 9/2003 | Pfaendtner et al. | |
| 6,887,519 | B1 | * | 5/2005 | Pillhoffer et al. | 427/237 |
| 6,989,174 | B2 | * | 1/2006 | Heng et al. | 427/237 |

* cited by examiner

*Primary Examiner* — David Turocy

(74) *Attorney, Agent, or Firm* — Miller, Matthias & Hull LLP

(57) ABSTRACT

A method of applying an aluminide coating to an internal cavity of a metal part, such as an airfoil. The method includes inserting a perforated sealed container containing a source of aluminide into the internal cavity and vaporizing the aluminide source to form an aluminide coating on the wall surface of the cavity.

4 Claims, 5 Drawing Sheets

APPLYING VAPOUR PHASE ALUMINIDE COATING ON AIRFOIL INTERNAL CAVITIES USING IMPROVED METHOD

FIELD OF THE INVENTION

This invention relates in general to a coating method and, more specifically, to a method of coating the internal cavities of an airfoil.

BACKGROUND OF THE INVENTION

Aluminide coating of the airfoils is a common process in airfoil repair. The repair requires the coating of both the external and internal airfoil surfaces. The process of coating requires maintaining the airfoil in a mist of hot aluminide vapours. The coating of external surfaces of the airfoil by this process is standard in the industry.

The process of coating the internal surfaces of the vane is difficult. To coat the cavity of the vane, the coating vapours must travel to the internal cavity by using specially designed fixtures.

There is therefore a need for coating the internal surfaces of the vane without having to make complex coating pans and other complex fixturing.

SUMMARY OF THE INVENTION

It is therefore an object of the present invention to overcome the problems of the prior art described above.

It is another object of the present invention to provide a method of coating the surface of internal cavities of metal parts.

It is yet another object of the present invention to provide a method for forming an aluminide coating on the internal surface of a metal part.

It is a further object of the present invention to provide a method for forming an aluminide coating on surface of an airfoil.

It is another object of the present invention to provide a device which enables the efficient aluminde coating of internal cavities of metal parts.

It is a further object of the present invention to provide a device for aluminide coating internal cavities in airfoils which is inserted in the cavity during the coating process The invention is directed to the application of a vapour phase coating of aluminide to an internal airfoil surface. The process includes coating the external and internal surface of an airfoil simultaneously through the use of specially fabricated granule holders. The granule holders are designed to be placed inside the vanes and eliminate the need for the complex prior art hardware, such as coating pans and the required control of the coating vapour stream to the internal cavity through the use of specially designed fixtures. In one embodiment, the internal granule holder is made of metal in the form of an elongated hollow cylinder with a plurality of holes or orifices through its side wall. The holder may optionally be encased in an outer cylindrical fixture which is inserted into the cavity to be in position to coat the inner surface of the cavity.

BRIEF DESCRIPTION OF THE DRAWINGS

For a further understanding of these and objects of the invention, reference will be made to the following detailed description of the invention which is to be read in connection with the accompanying drawing, where.

DETAILED DESCRIPTION

Figure 1:
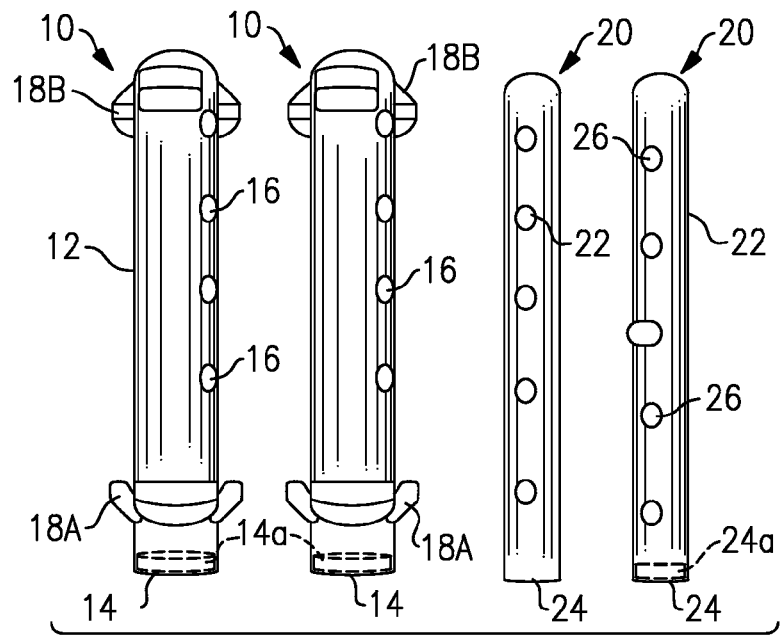
FIG. 1 is a side view of the granule holders of the present invention.

FIG. 1 illustrates the granule holders of the present invention as two separate pairs having a slightly different size and configuration. Holders 10 have a thicker wall thickness and are larger than holder 20. Holder 10 is in the form of an elongated hollow metal cylinder 12 having an open end 14 and opposite closed end. Holder 10 further contains a plurality of holes 16 through its side wall to allow for the passage of aluminide vapor during the coating process. Flanges 18A and 18B aid in stopping and positioning the holder within the airfoil cavity. Holders 20 are slightly smaller in size, have a smaller wall thickness, but have similar holes 26 through the side wall of cylinder 22, and also an open end 24. The holders are normally sealed after loading with the granular material with sealing caps 14a and 24a. Holders 10 and 20 both function to hold an appropriate load of granular aluminide material which when heated under the proper conditions, will vaporize and form an aluminide coating on the internal cavity surfaces of an airfoil. The holder may be made of any suitable high temperature alloy. Inconel 600 has been found to be a suitable material.

Figure 2:
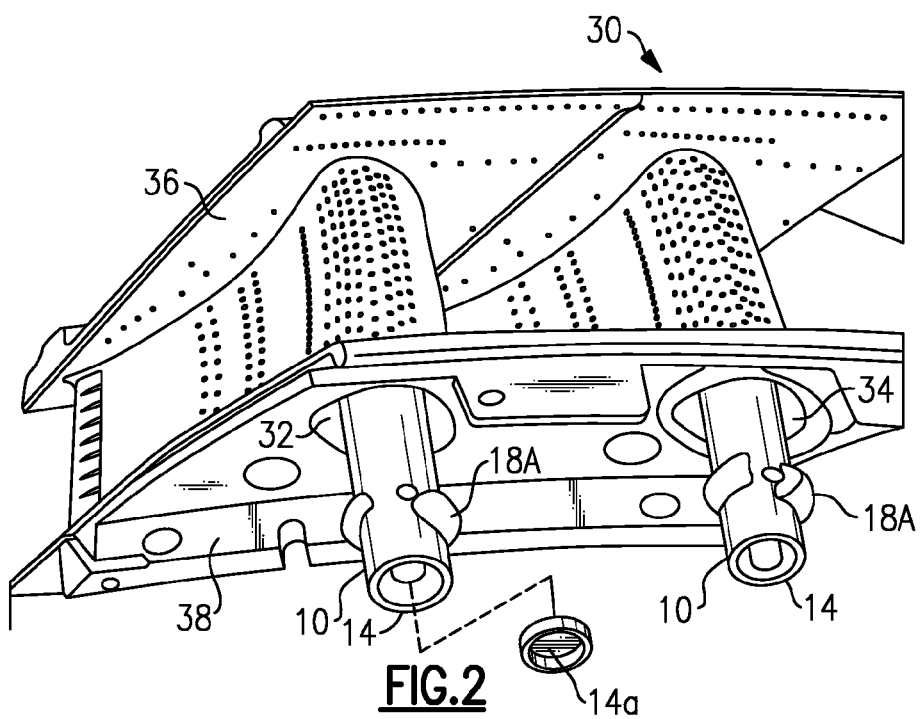
FIG. 2 is a perspective view showing the granule holders of FIG. 1 partially inserted into the internal cavities of a turbine airfoil.

FIG. 2 illustrates a turbine airfoil 30 having internal cavities 32 and 34 with holders 10 partly inserted to illustrate holder positioning. In aluminiding, both the internal surfaces of cavities 32 and 34, and the outside surface of airfoil 30, i.e. 36, 38, etc. are simultaneously coated with an aluminide coating.

Figure 3:
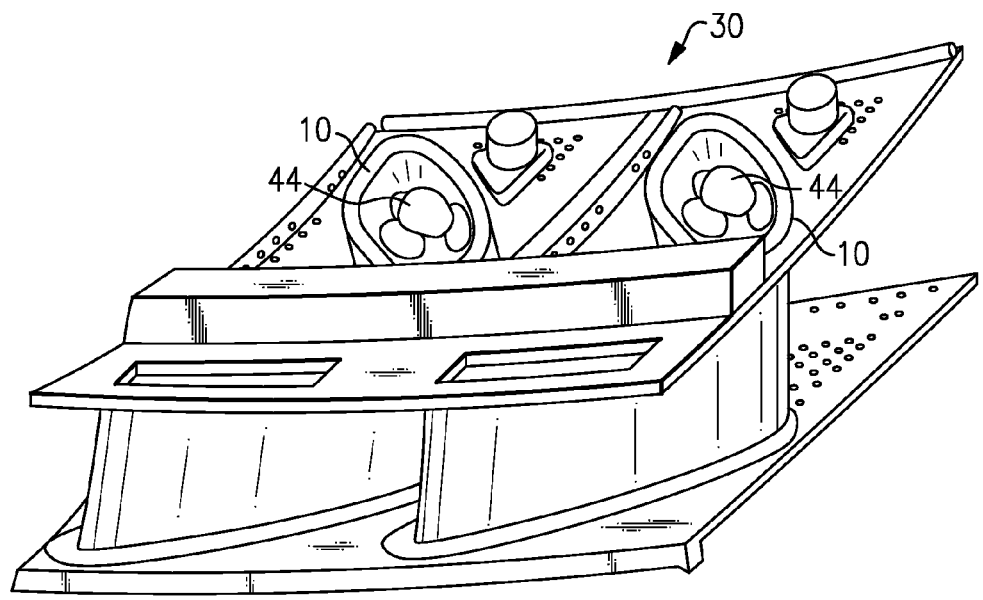
FIG. 3 is a second perspective view showing the granule holders in place within the airfoil cavities.

FIG. 3 is another view of airfoil 30 showing holder 10 in place containing granular aluminide material 44.

Figure 4:
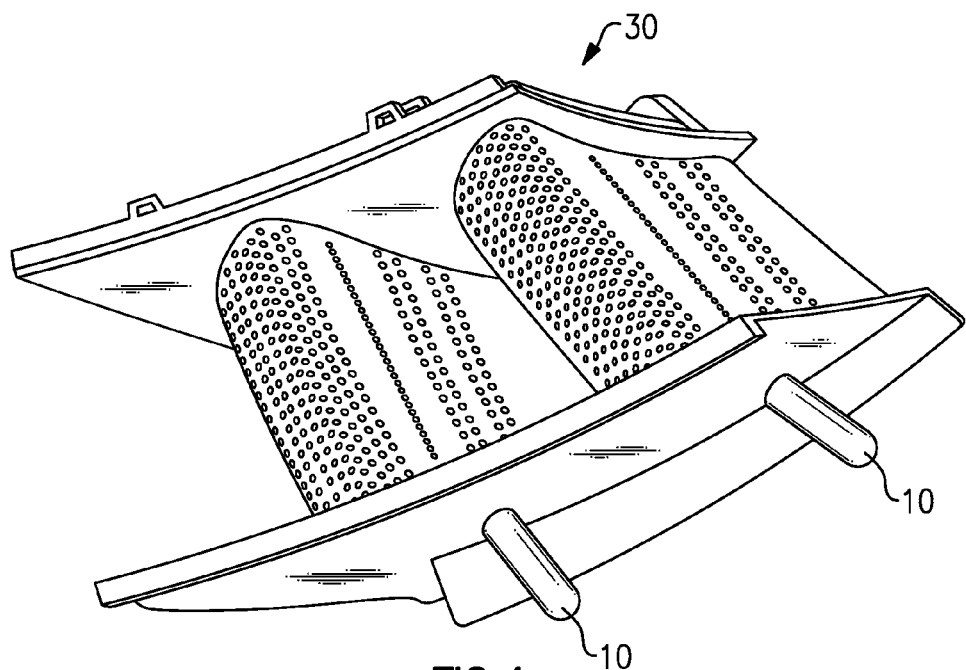
FIG. 4 is a third perspective view with the granule holders partially inserted in the internal cavities.

FIG. 4 is a further view of airfoil 30 with granular holders 10 partially inserted in the airfoil cavities.

Figure 5:
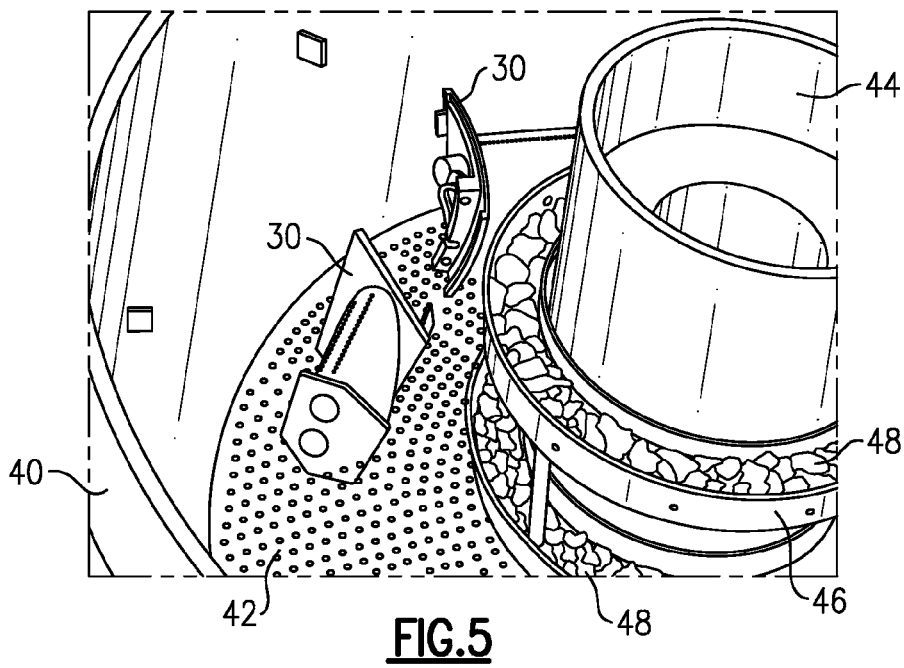
FIG. 5 is a perspective view of the component setup inside a coating pan.

FIG. 5 illustrates the coating pan 40 and components set up for the process of the present invention. The coating pan 40 contains a support floor for the parts to be treated. The coating pan contains a center ring 44 which supports a granular holder 46 which contains the aluminide granules 48 and any other component(s) such as an activator.

Vapor phase aluminide coating is well know in the art and has been used to form a protective coating on airfoil surface to inhibit oxidation. The surface to be treated is coated with a diffusion aluminide An activator or precursor material such as an aluminum halide optionally can be used with other modifying elements.

The diffusion aluminide coating is typically in the range of about 0.005 to 0.003 inches thick. When exposed to a high temperature oxidizing environment, the aluminum enriched region at the airfoil surface oxidizes to form a highly adherent layer of protective aluminum oxide ($Al_2O_3$) which functions to inhibit oxidation damage. Reactive and noble aluminide modifying elements such as Hf, Zr, Yt, Si, Ti, Ta, Co, Cr, Pt and Pa and combinations thereof may also be used in forming the aluminide layer.

U.S. Pat No. 6,616,969 is representative of the state of the art with regard to vapor phase aluminide coating and is incorporated in its entirety herein by reference.

In one embodiment a CrAl alloy is used as the specific aluminide material in CrAl 55/45% concentration. The following example represents one embodiment of a process sequence of the present invention which is suitable in carrying out the present invention.

Figure 6:
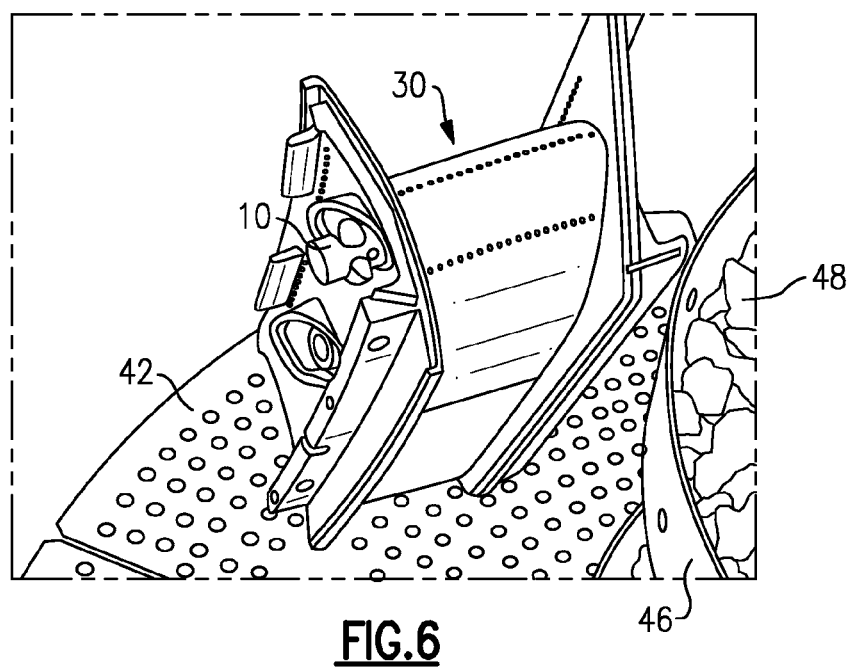
FIG. 6 is an enlarged perspective view of FIG. 5 showing the granule holders in place.
Figure 8:
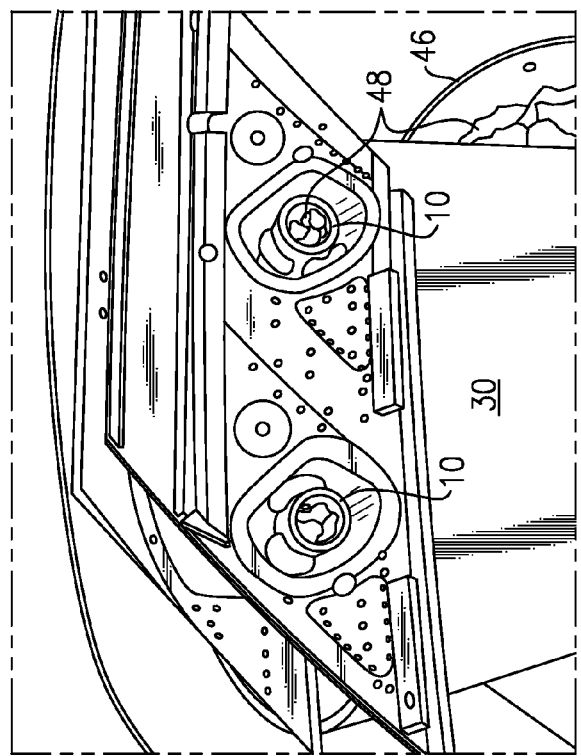
FIG. 8 is an enlarged view of the airfoil in FIG. 7 showing the position of a granule holders in the cavities.
Figure 7:
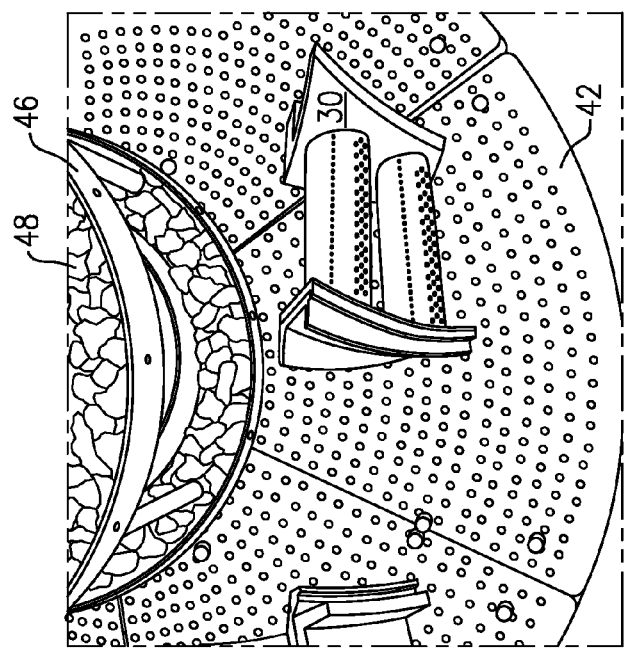
FIG. 7 is a perspective top view of the coating pan showing the position of the airfoil to be coated.

| | Example |
|---|---|
| 1. | Clean turbine airfoil to be coated with abrasive grit blasting. |
| 2. | Insert internal granule holder with filled premixed granules and activator into parts' cavity for internal coating. The blended mix contains approximately 100 grams of fine CrAl granules 2 to 3 mm in size, and 50 grams of aluminum fluoride. |
| 3. | Prepare the ring type-coating pan (FIGS. 5 & 6) with approximately 1200 grams of new granules. There are 3 layers of coating media at the bottom of the coating pan. The layer of aluminum fluoride is sandwich between the top and bottom layer of granules. |
| 4. | The turbine airfoil 30 together with the internal granule holder inserted is then loaded in the coating pan. |
| 5. | Place the coating pan into a retort, and connect gas piping to the coating pan and retort. Both Argon, and Hydrogen will be used before the heating cycle. The flow rates of hydrogen and argon are at about 150 CFH for retort and 50 CFH for coating pan. Argon is used only during purging. |
| 6. | Load the retort into furnace, and heat up to 1975 ± 25° F. During the heating up, supply a 15 CFH of Hydrogen is maintained for the first 7.5 hours. Flow rate for retort is 150 FCH. |
| 7. | The coating cycle will start once the temperature reaches 1975 ± 25° F., and is maintained at this temperature for about 8.5 hours. |

| | Example |
|---|---|
| 8. | The coating pan, and retort are then cooled by increasing Hydrogen flow after the thermocouple reaches 600° F. to complete the coating cycle. |

Figure 9:
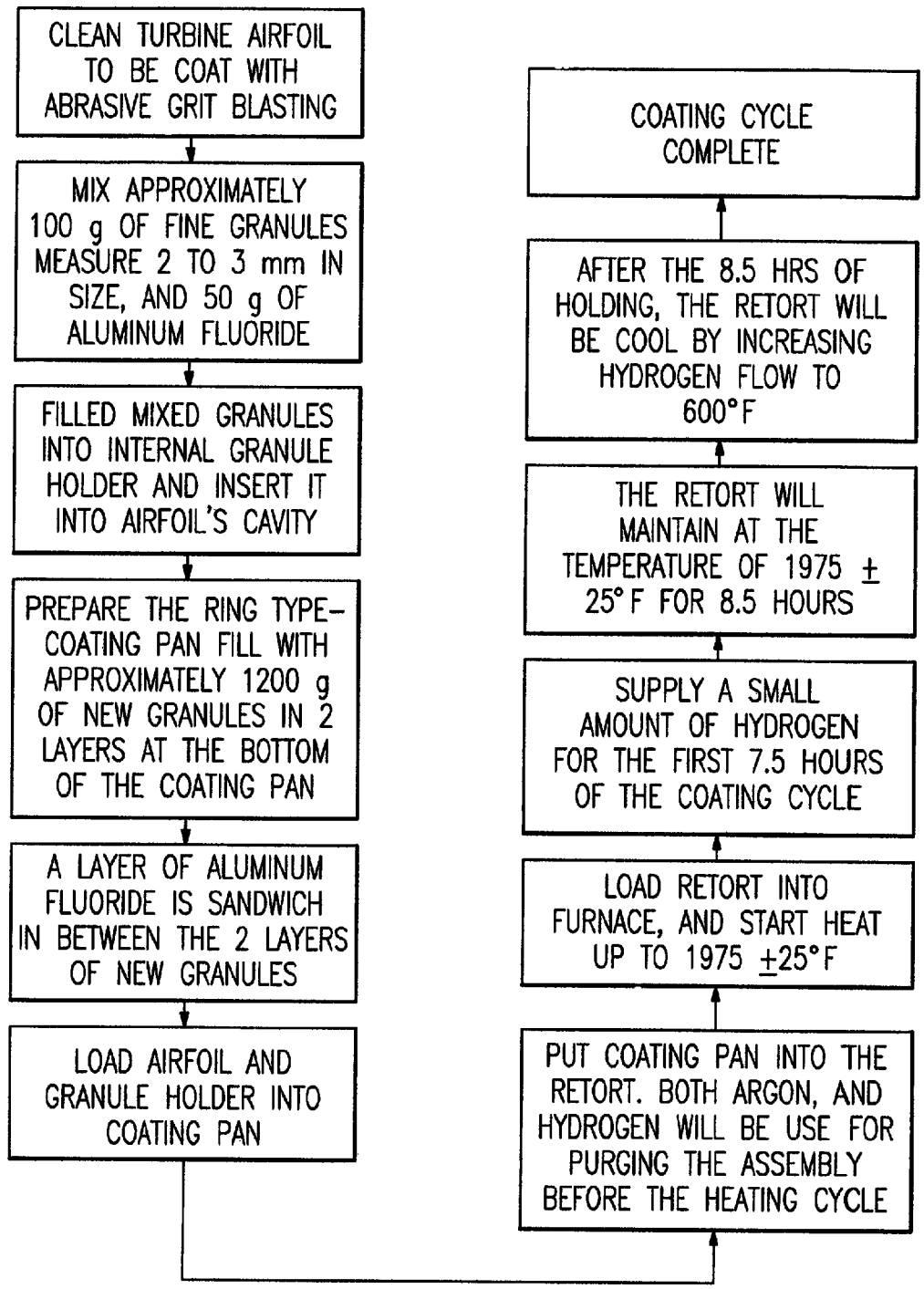
FIG. 9 is a graphical illustration of the process of the present invention.

The flow chart in FIG. 9 graphically illustrates the process of the present invention.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. A method of forming an aluminide coating on the external and internal surfaces of an airfoil which comprises:
    (a) providing an airfoil to be coated which has an outer surface and an internal cavity;
    (b) applying a vapour phase coating of aluminide to said airfoil; and
    (c) wherein the application of said coating includes the placement of a source for aluminide vapour within said cavity, wherein the source of aluminide within said cavity is contained within a device which is inserted in said cavity, and wherein said device is an enclosed container which has a plurality of holes through the side walls of said container.

2. The method of claim 1 in which said device is in the form of a hollow enclosed container having a plurality of holes through its side wall and which contains a source of granular aluminide.

3. The method of claim 2 in which the device is in the form of a hollow cylindrical holder having a plurality of holes through its side wall.

4. The method of claim 1, wherein said source of aluminide is in the form of at least one aluminide granular holder which is placed within said cavity.

* * * * *